United States Patent
Srinivas et al.

(10) Patent No.: US 8,957,714 B2
(45) Date of Patent: Feb. 17, 2015

(54) MEASURE-BASED DELAY CIRCUIT

(71) Applicant: QUALCOMM Incorporated, San Diego, CA (US)

(72) Inventors: Vaishnav Srinivas, San Diego, CA (US); Jan Christian Diffenderfer, Escondido, CA (US); Philip Michael Clovis, San Diego, CA (US); David Ian West, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/831,201

(22) Filed: Mar. 14, 2013

(65) Prior Publication Data

US 2014/0266357 A1    Sep. 18, 2014

(51) Int. Cl.
*H03L 7/00* (2006.01)
*H03K 5/159* (2006.01)

(52) U.S. Cl.
CPC .................................... *H03K 5/159* (2013.01)
USPC ........... 327/161; 327/153; 327/152; 327/150; 327/159

(58) Field of Classification Search
USPC ...................... 327/141, 144–163; 331/15–17; 375/373–376
See application file for complete search history.

(56) References Cited

U.S. PATENT DOCUMENTS

| | | | |
|---|---|---|---|
| 5,935,257 A | 8/1999 | Nishimura | |
| 6,232,806 B1* | 5/2001 | Woeste et al. | 327/149 |
| 6,741,522 B1* | 5/2004 | Lin | 368/118 |
| 6,995,554 B2* | 2/2006 | Loke et al. | 324/76.54 |
| 7,042,296 B2* | 5/2006 | Hui et al. | 331/17 |
| 7,157,948 B2 | 1/2007 | McClannahan et al. | |
| 7,161,402 B1* | 1/2007 | Sompur et al. | 327/158 |
| 7,352,165 B2* | 4/2008 | Loke et al. | 324/76.53 |
| 7,414,444 B2* | 8/2008 | Drexler et al. | 327/158 |
| 7,423,462 B2* | 9/2008 | Drexler et al. | 327/158 |
| 7,619,453 B2 | 11/2009 | Ma et al. | |
| 2005/0280407 A1* | 12/2005 | Loke et al. | 324/76.54 |
| 2006/0033544 A1* | 2/2006 | Hui et al. | 327/276 |
| 2011/0215851 A1 | 9/2011 | Oh et al. | |
| 2012/0249200 A1 | 10/2012 | Yu | |

* cited by examiner

*Primary Examiner* — Brandon S Cole
(74) *Attorney, Agent, or Firm* — Haynes and Boone, LLP

(57) ABSTRACT

A master measure circuit is disclosed that may select from various nodes on a delay path carrying a signal. The master measure circuit measures the delay for propagation of the signal from one selected node to another selected node and controls an adjustable delay circuit in the delay path accordingly.

13 Claims, 4 Drawing Sheets

MEASURE-BASED DELAY CIRCUIT

TECHNICAL FIELD

This application relates to adjustable delay circuits, and more particularly to a measure-based control of an adjustable delay circuit.

BACKGROUND

In a source-synchronous architecture, one integrated circuit is the source of the clock and data for another integrated circuit. The integrated circuit providing the clock and data is denoted as the source integrated circuit whereas the integrated circuit (or circuits) receiving the clock and data is denoted as a receiving integrated circuit. Because the source integrated circuit forwards the clock to the receiving integrated circuit, such a system is also referred to as a forwarded clock architecture. Source-synchronous systems are popular because the process, voltage, and temperature (PVT) variations for the forwarded clock will generally match the PVT variations in the data. In a double-data-rate (DDR) architecture, the receiving integrated circuit delays the clock in a delay element to allow for proper setup time of the data with regard to a resulting delayed version of the clock. For example, if the clock is delayed by T/4 relative to the data, where T is the clock period, the optimal amount of setup time is achieved in a DDR system.

The delay element or circuit in the receiving integrated circuit is typically an adjustable delay element so that the adjustable delay element can be controlled to accommodate PVT variations. The control of the adjustable delay element to achieve a desired amount of delay may be accomplished using a master/slave control architecture such as shown in FIG. 1A for a slave device 100 and a master device 105. Master device 105 includes a copy of an adjustable delay element (not illustrated) in slave device 100 that is calibrated through, for example, a phase-locked loop (PLL). Master device 105 calibrates its adjustable delay element to the desired delay such as T/4 and commands slave device 100 to use the same setting on its adjustable delay element. Since master device 105 and slave device 100 both have the same adjustable delay elements, the applied settings in slave device 100 should achieve the same delay as was calibrated in master device 105.

An alternative to a master/slave architecture is a dual-master architecture such as shown in FIG. 1B for a pair of dual-master devices 110 and 115. Each dual-master device 110 and 115 includes an adjustable delay element and alternates in cycles between functioning as a calibrating element or a service element. At any given cycle, one of the dual-master devices is calibrating its adjustable delay element whereas the remaining dual-master device (having been calibrated in the preceding cycle) functions as the service element such that its adjustable delay element delays the desired signal. In the particular cycle for FIG. 1B, dual-master device 115 is calibrating whereas dual-master device 110, having already been calibrated in a previous cycle, functions as a service element. Since each dual-master device independently calibrates its adjustable delay element, dual-master device 110 need not include a copy of the adjustable delay element in dual-master device 115. However, it is convenient from a design perspective that each dual-master device has an identical adjustable delay element. After a given amount of time in these service and calibrating roles, a new cycle would ensue in which dual-master device 115 would be the service element whereas dual-master device 110 would calibrate.

The dual-master architecture requires a pair of dual-master devices for every delay element instantiation. In contrast, only a single master device is required in a master/slave architecture. For example, there could be ten slave devices 100 controlled by a single master device 105 (for a total of eleven devices). In contrast, the same ten adjustable delay elements would require ten dual-master devices 110 and another ten dual-master devices 115 in a dual-master architecture (a total of twenty devices).

Although a master-slave architecture is thus much denser with regard to the instantiation of a plurality of adjustable delay elements in an integrated circuit, the control is open loop in that an assumption is made that the same settings (e.g., a control voltage, current, or a digital code) as determined in master device 105 to produce a calibrated delay will produce the same amount of delay in slave device 100. But there can be process variations across the die from master device 105 to slave device 100 such that the open loop control becomes inaccurate, particularly at higher data rates. Moreover, the localized circuitry around slave device 100 may be different from the local environment for master device 105, which can also make the open loop control inaccurate. In contrast, in a dual-master architecture, a calibrated dual-master device then functions as a service element. So there can be no process variations in a dual-master system. Moreover, the local electrical environment will be substantially the same although local systems may switch on or off during the time a service element functions.

Accordingly, there is a need in the art for an adjustable delay element having the accuracy of a dual-master system while having the density advantages of a master/slave system.

SUMMARY

A master measure circuit is disclosed that may select from various nodes on a delay path carrying a signal. The master measure circuit measures the delay for a signal propagating from a first selected one of the nodes to a second selected one of the nodes and controls an adjustable delay circuit in the delay path accordingly.

DETAILED DESCRIPTION

A master measure circuit is provided that controls a slave adjustable delay circuit. Although it is denoted as a "master" measure circuit, it does not control the slave adjustable delay circuit in an open loop control fashion as discussed above for conventional master/slave control architectures. Thus, the slave device's adjustable delay circuit does not suffer from the process, temperature, and localized environment variations that produce inaccurate delays in an open loop control system. This is quite advantageous as the master measure circuit may control a plurality of slave adjustable delay circuits so as to have the die savings of a conventional master/slave control architecture without its associated open loop control inaccuracies.

Overview

Figure 1A:
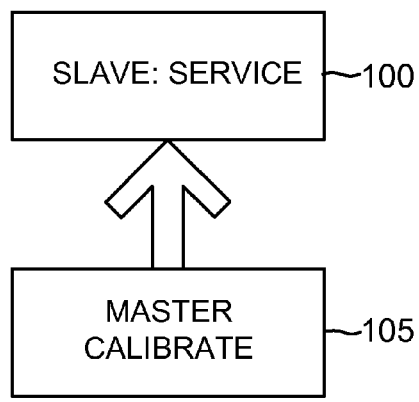
FIG. 1A is a block diagram of a conventional master/slave control architecture for an adjustable delay circuit.
Figure 1B:
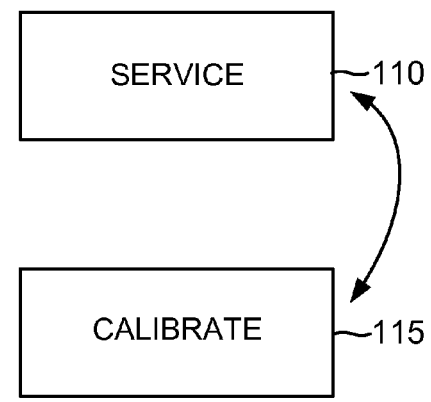
FIG. 1B is a block diagram of a conventional dual-master control architecture for an adjustable delay circuit.
Figure 2:
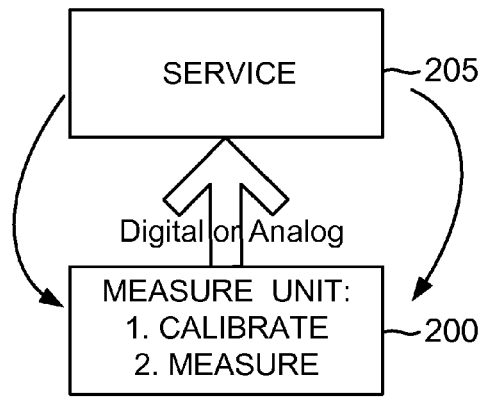
FIG. 2 is a high-level block diagram of a master measure circuit and a slave adjustable delay circuit.

An example master measure circuit 200 as shown in FIG. 2 includes a calibrated adjustable delay circuit to achieve a known amount of delay. To perform this calibration of its calibrated adjustable delay circuit, master measure circuit 200 may have, for example, a master/slave or dual-master control architecture as discussed previously with regard to FIGS. 1A and 1B. Because the calibrated adjustable delay circuit provides a known, calibrated amount of delay, master measure circuit 200 can use this known amount of delay as a "yardstick" to measure a delay associated with a slave adjustable delay circuit 205. For example, slave adjustable delay circuit 205 may be included in a clock tree path for a forwarded clock (not illustrated). Such a clock tree will have a variety of elements such as registers and buffers so that various elements coupled to the clock tree can receive a synchronous version of the forwarded clock. To keep the forwarded clock aligned with the data, it is conventional to mimic the clock tree delay in the data path for the data. But this is problematic because unnecessary elements such as buffers that are inserted into the data path simply to mimic the corresponding clock tree for the forwarded clock introduce undesirable jitter into the data.

Master measure circuit 200 frees a designer from balancing the data path to the clock tree. The data path can instead be designed to be as short as possible and free of buffers and other elements whose only function was to mimic the delay in the corresponding clock tree or delay path for the forwarded clock. Since the delay in the clock tree is then unbalanced with comparison to the delay in the data path, master measure circuit 200 uses its known and calibrated "measure" of delay from its calibrated adjustable delay circuit to measure the delay between various points in the clock tree. Based upon these measurements, master measure circuit 200 can then command slave adjustable delay circuit 205 to adjust its delay accordingly.

Not only does the balancing of the data path to the clock tree in conventional architectures disturb the data unnecessarily with jitter as discussed above, a dual-master control architecture becomes necessary in demanding high-data-rate applications to make the T/4 delay circuit precise because the open loop control of a master/slave architecture can lead to errors as discussed above. The need for precise dual-master T/4 delay circuits is thus not only costly in terms of die space, it is also noisy because of the jitter introduced by balancing the data path to the clock tree. But master measure circuit 200 avoids these problems: not only can the data path be designed without balancing its delay to that of the clock tree, a single master measure circuit 200 can control multiple slave adjustable delay circuits 205. Master measure circuit 200 thus not only enables cleaner data transmission, it is also saves die space as compared to traditional dual-master or master/slave control architectures.

To calibrate its calibrated adjustable delay circuit, master measure circuit 200 may have a dual-master or a master/slave control architecture. In a dual-master embodiment, master measure circuit 200 would include two dual-master adjustable delay circuits that would alternate between calibrating and service modes as discussed further below. In such an embodiment, the service-mode dual-master adjustable delay circuit would serve as the calibrated adjustable delay circuit. Alternatively, the calibrated adjustable delay circuit in master measure circuit 200 may comprise a slave adjustable delay circuit that is controlled by a master adjustable delay circuit in a master/slave control architecture as also discussed further below. In either control architecture, master measure circuit 200 uses its calibrated adjustable delay circuit to measure the delay between various points in a clock tree path (or between various points on other types of delay paths). Based upon the measurement, master measure circuit 200 would then control slave adjustable delay circuit 205 accordingly.

Regardless of the control architecture for its calibration, the calibrated adjustable delay circuit in master measure circuit 200 need not be identical to slave adjustable delay circuit 205. Indeed, the calibrated adjustable delay circuit (since it need be instantiated just once with the regard to the control of multiple slave adjustable delay circuits 205) may be more precise than the slave adjustable delay element. In contrast, slave delay elements 205 may be less precise, which lowers costs. Despite this lowered precision, the desired amount of delay is accurately achieved because of the measurement and control from master measure circuit 200. Thus, master measure circuit 200 enjoys the density and cost advantages of a master/slave architecture with regard to the control of slave adjustable delay circuit 205. However, master measure circuit 200 provides a number of advantages as compared to a conventional master/slave architecture. For example, the control of each slave adjustable delay circuit 205 is not open loop: each slave's delay may be measured directly by master measure circuit 200 and adjusted accordingly to obtain a desired amount of delay. Master measure circuit 200 may adapt its control of slave adjustable delay circuit 205 responsive to repeated measurements. In this fashion, master measure circuit 205 can account for offsets in voltage and temperature over time.

Example Embodiment

Figure 3A:
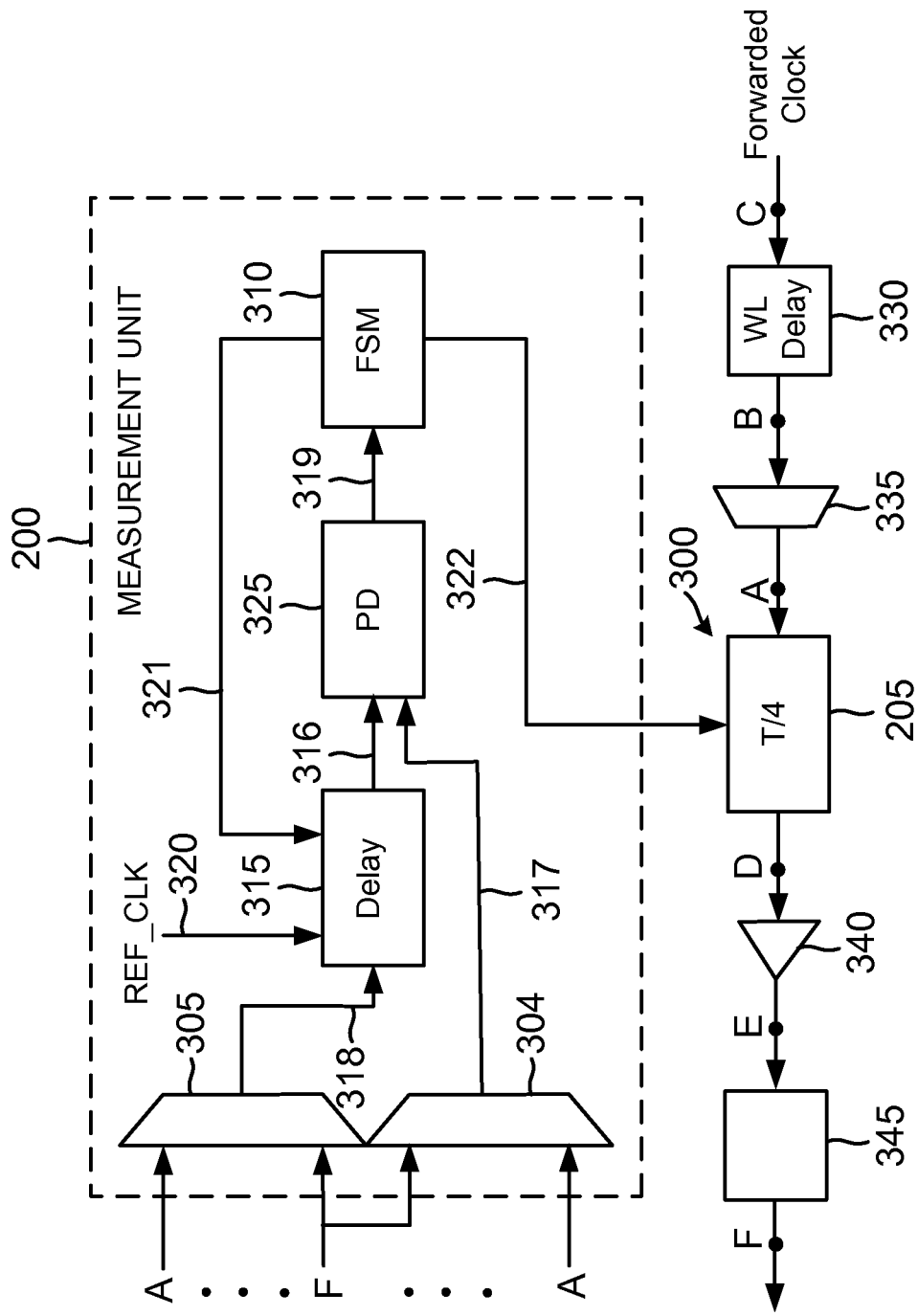
FIG. 3A is a block diagram of a master measure circuit and a slave adjustable delay circuit included in an example delay path.

The measurement of the delays between various selected points in a signal path by master measure circuit 200 may be performed using digital or analog circuitry. The following discussion concerns a digital measurement implementation but it will be appreciated that an analog architecture such as a PLL could also be used to perform the delay measurements. Moreover, the following discussion will assume that the delay measurements are performed with regard to a forwarded clock. However, the delay for any suitable signal propagating through a delay path can be measured and controlled by master measure circuit 200. For example, master measure circuit 200 may be included in a source circuit producing the forwarded clock to provide the source circuit with the advantageous delay measurement features discussed further herein. FIG. 3A illustrates an embodiment in which slave adjustable delay circuit 205 is a T/4 delay circuit within a clock tree or delay path 300 for a forwarded clock. As known in the forwarding clock arts, delay path 300 includes various elements both upstream and downstream from T/4 delay circuit 205. In this embodiment, delay path 300 receives the forwarded clock on a node C prior to processing in a write level (WL) delay element 330. In between WL delay element 330 and T/4 delay circuit 205 is a multiplexer 335. A node B is at the input to multiplexer 335 and a node A is at its output. T/4 delay circuit is positioned between node A and a node D on delay path 300. A clock tree buffer 340 sits between node D and a node E at the input to a register 345. Finally, a node F is at the output of register 345 in delay path 300. It will be appreciated that elements 330, 335, 340, and 345 are merely representative of the myriad elements that may be present in a given delay path. The concepts and techniques disclosed herein are widely applicable to any number of selectable nodes on a delay path and are independent of the various circuits and modules that may separate these nodes.

As the forwarded clock propagates from node A to node F, the forwarded clock is successively delayed. The state of the clock at any given one of the nodes may be said to comprise a "version" of the clock. For example, the version of the clock at node B is delayed with regard to the version of the clock at node C. Nodes A through F are all selectable nodes by master measure circuit 200. In other words, master measure circuit 200 selects for any two of the nodes and measures the delay between the corresponding clock versions. Nodes A, B, and C are upstream from T/4 delay circuit 205 such that the forwarded clock passes through nodes A, B, and C before being delayed by T/4 circuit 205. Similarly, nodes D, E, and F are downstream of T/4 delay circuit 205 in delay path 300. Master measure circuit 200 includes a multiplexer 305 and a multiplexer 304 to make the node selections (and receive the corresponding clock versions). The clock version selected by multiplexer 305 forms an output signal 318 that is delayed by a calibrated adjustable delay circuit 315 to form a delayed signal 316. The clock version selected by multiplexer 304 forms an output signal 317 that is not delayed through calibrated adjustable delay circuit 315. To measure the delay between the output signals 316 and 317 (which then represents the delay for the forwarded clock signal propagation between the selected nodes), master measure circuit 200 controls calibrated adjustable delay circuit 315 using a control signal 321 (e.g., a control voltage, current, or digital code) such that there is no delay between its delayed signal 316 and output signal 317 from multiplexer 304. For example, suppose multiplexer 305 selects for node C whereas multiplexer 304 selects for node F. The delay between the multiplexer output signals 318 and 317 then represents the entire delay on delay path 300 between points C and F for the forwarded clock (assuming that multiplexers 304 and 305 are de-skewed relative to each other).

Advantageously, calibrated adjustable delay circuit 315 need not be calibrated to any particular unit of delay. But so long as calibrated adjustable delay line 315 behaves linearly over its adjustment range, its adjusted delay will have a known relationship to its pre-existing (and known) calibrated delay. Alternatively, it may have a nonlinear behavior over its adjustment range so long as this nonlinearity is known and can be mapped as a function of the pre-existing calibrated delay. For example, suppose the known calibrated delay is "X" seconds, where X is some arbitrary value generally in the range of what is expected to be measured between the selected nodes. Suppose that nodes C and F are then selected as discussed above and calibrated adjustable delay line 315 is adjusted to provide a delay of X/2 to have no (or substantially no) delay between signals 316 and 317. The delay between nodes C and F for the forwarded clock in delay path 300 can thus be assumed to equal X/2 (again, assuming that multiplexers 304 and 305 are de-skewed).

Master measure circuit 200 may comprise analog control circuitry and/or digital control circuitry to adjust calibrated adjustable delay circuit 315 through control signal 321. In the embodiment illustrated in FIG. 3A, digital control circuitry is provided that includes a finite state machine (FSM) 310 and a phase detector 325. Phase detector 325 provides a digital lead/lag signal 319 to FSM 310. Digital lead/lag signal 319 indicates whether output signal 316 leads or lags output signal 317. FSM 310 is configured to adjust control signal 321 such that digital lead/lag signal 319 is in equipoise as to whether signal 316 leads or lags signal 317. At such a point, the propagation delay for the forwarded clock between the selected nodes corresponds to the delay provided by calibrated adjustable delay circuit 315 responsive to the control from control signal 321. For example, if no adjustment of calibrated adjustable delay circuit 315 is necessary (signals 316 and 317 being edge-aligned), then FSM 310 can assume that the delay for the propagation of the forwarded clock between the two selected nodes equals the pre-existing known delay for calibrated adjustable delay circuit 315. If, on the other hand, if calibrated adjustable delay circuit 315 must be controlled to produce twice the amount of its calibrated known delay, then FSM 310 can assume that the delay for the forwarded clock between the two selected nodes on delay path 300 is twice the calibrated known delay.

This ability to measure the delay between various nodes on delay path 300 is quite advantageous—for example, as discussed above, the corresponding data path need no longer be balanced to delay path 300. Although the data path can then be optimized accordingly, it will now longer be balanced with respect to components such as elements 330, 335, 340, and 345 in delay path 400. But temperature or process variations may make these components provide too little or too much delay. Even if T/4 delay circuit 205 is balanced perfectly to provide the desired delay of T/4, such a delay line 300 will then drift away from the desired performance. In other words, despite having a delay of T/4, T/4 delay circuit 205 could then delay the forwarded clock such that it is too advanced or delayed from its intended timing relationship to the data. But master measure circuit 200 can measure such delay variations in components such as elements 330, 335, 340, and 345 to then adjust T/4 delay circuit 205 accordingly using an appropriate control signal 322 (e.g., a control voltage and/or control current). Moreover, such adjustment of T/4 delay circuit 205 can be closed loop in that master measure circuit 200 may be configured to repeat the delay measurement (assuming one selected node is upstream and the remaining selected node is downstream to T/4 delay circuit 205) to determine if the desired amount of delay has been obtained. Moreover, FSM 310 could be configured to be adaptive—in other words, it would vary the control through control signal 322 depending upon the current and previous behavior it has observed for delay path 300. The resulting control is not only very flexible but it is also precise yet it has the die area economy of traditional open-loop master/slave control architectures.

To measure whether the delay is T/4 from T/4 delay circuit 205, multiplexer 305 may be controlled to select for node A (the input to T/4 delay circuit 205) whereas multiplexer 304 would then be controlled to select for node D (its output). Note that the calibrated and known delay from calibrated adjustable delay circuit 315 need not be T/4—so long as it is known, the delay measurement can be made in comparison to this known amount. Calibrated adjustable delay circuit 315 does not have to be a duplicate of T/4 delay circuit 205 but instead may be of a more precise construction. Such precision is not burdensome since there need be only one master measure circuit 200 for the control of multiple T/4 delay circuits 205.

Master measure circuit 200 provides advantageous flexibility with regard to the selection through multiplexers 305 and 304 in that any pair of nodes may be selected through multiplexers 305 and 304. For example, multiplexers 305 and 304 may be controlled to select only from nodes A, B, and C (note that this control may be provided by FSM 310 or from external control logic). Conversely, multiplexers 305 and 304 may be controlled to select only from nodes D, E, and F. In both these examples, the resulting delay measurement does not involve any delay through T/4 delay circuit 205. Nevertheless, T/4 delay circuit 205 may then be adjusted accordingly if these delay measurements are not as expected or desired. In other words, suppose such a measurement indicates that an element such as multiplexer 335 is running too fast or too slow. T/4 delay circuit 205 may then be adjusted accordingly to account for this timing issue in multiplexer 335. In addition, master measure circuit 200 may measure and control with regard to a plurality of delay paths in addition to delay path 300. FSM 310 may be associated with registers (not illustrated) that store various states for control signal 322. Based upon a measurement, FSM 310 may then select the appropriate register to drive control signal 322 accordingly.

Figure 3B:
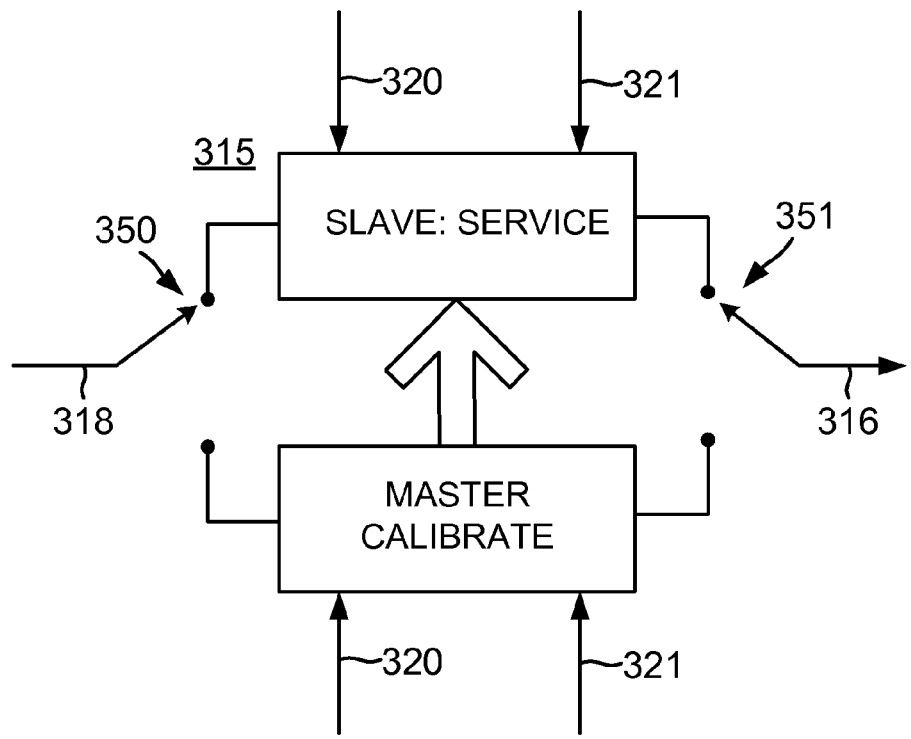
FIG. 3B is a block diagram of a master/slave embodiment for the calibrated adjustable delay circuit of FIG. 3A.

As discussed above, calibrated adjustable delay circuit 315 may be implemented using either a master/slave or a dual-master approach. A calibrated adjusted delay circuit 315 having a dual-master architecture is shown in FIG. 3B. Since either dual-master unit can act as the service element, output signal 318 from multiplexer 305 may be driven into either dual-master unit through a switch 350 that selects for the dual-master unit acting in the service mode. The dual-master unit in calibration mode would calibrate itself using reference clock 320 while the remaining dual-master unit performs in the service mode to drive delayed signal 316 through an output switch 351. Since either dual-master unit can act as the service unit, each dual-master unit receives control signal 321 from FSM 310.

Figure 3C:
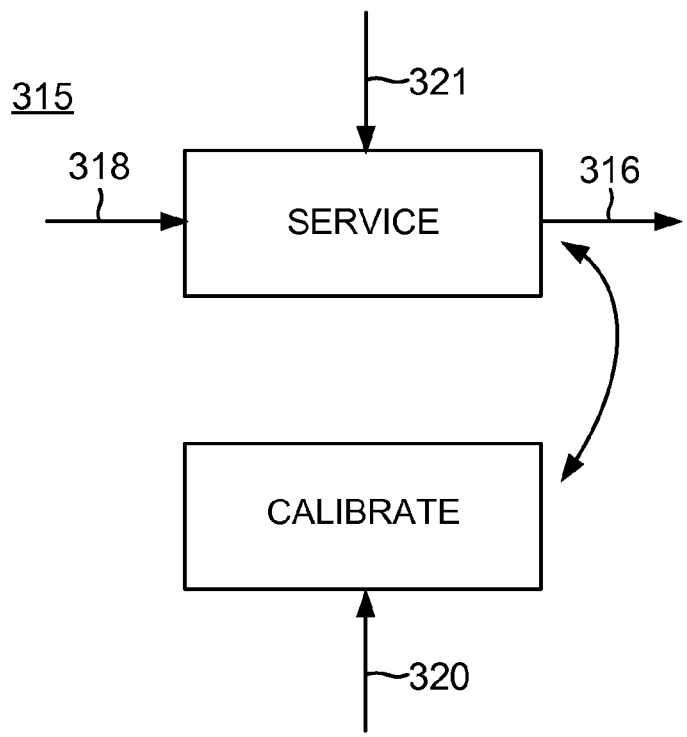
FIG. 3C is a block diagram of a dual-master embodiment for the calibrated adjustable delay circuit of FIG. 3A.

A master/slave instantiation for calibrated adjustable delay circuit 315 is shown in FIG. 3C. There is no need for any input or output switches since a dedicated slave delay circuit always acts in the service mode to provide delayed signal 316 responsive to delaying output signal 318 from multiplexer 305. A calibrating master circuit receives reference clock 320 so that it can calibrate the slave delay circuit accordingly. The dedicated slave delay circuit receives the FSM control signal 321 so that the amount of delay for delayed signal 316 may be adjusted during a measurement by the corresponding master measure circuit.

Example Method of Operation

Figure 4:
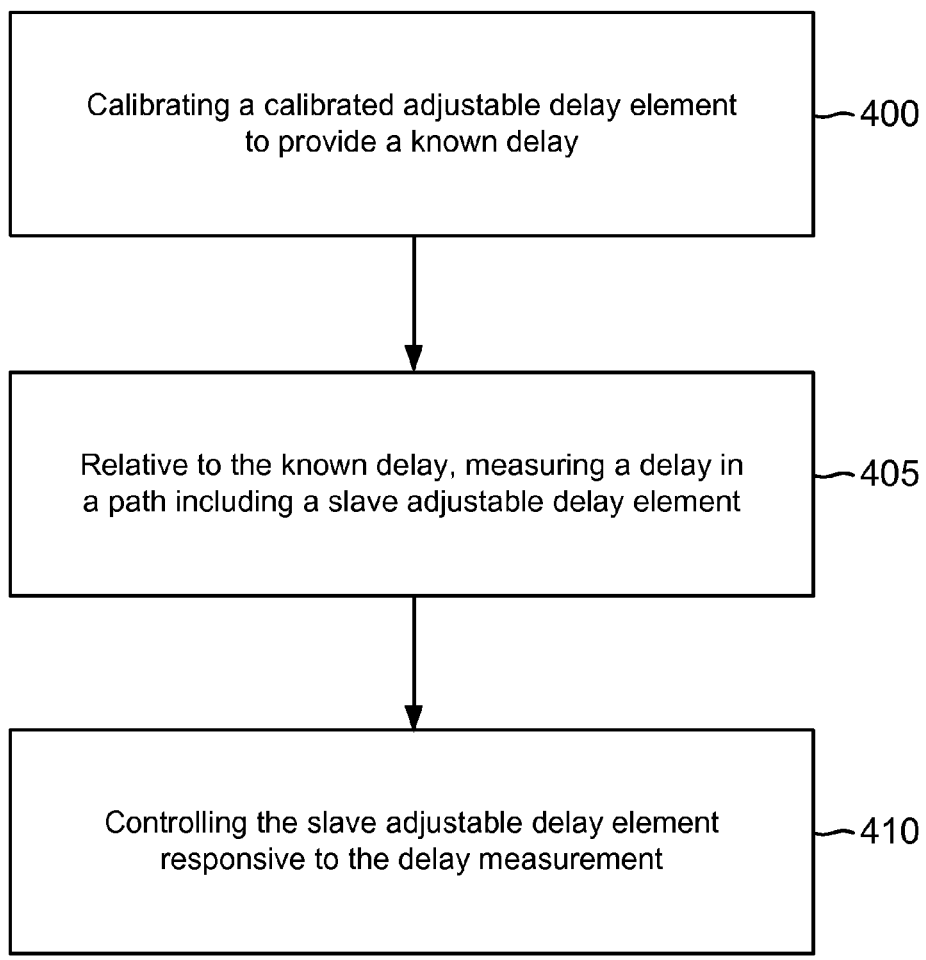
FIG. 4 is a flowchart for an example method.

A flowchart summarizing a method of operation for a master measure circuit T/4 is provided in FIG. 4. The method begins with a step 400 of calibrating the calibrated adjustable delay circuit in a master measure circuit to provide a known calibrated delay. Relative to this known delay, the method continues with a step 405 of measuring a delay in a path including a slave adjustable delay circuit. In addition, the method includes a step 410 of controlling the slave adjustable delay circuit responsive to the delay measurement.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A circuit, comprising:
   a delay path including a plurality of nodes and a slave adjustable delay circuit;
   a master measure circuit including a calibrated master adjustable delay circuit, the master measure circuit being configured to measure a delay between selected ones of the nodes for a signal propagated through the delay path, the measurement being relative to a known delay for the calibrated master adjustable delay circuit, the master measure circuit being further configured to adjust the slave adjustable delay circuit responsive to the measured delay;
   a first multiplexer configured to select from the plurality of nodes; and
   a second multiplexer configured to select from the plurality of nodes, wherein the first multiplexer is configured to provide an output signal to the calibrated master adjustable delay circuit, and wherein the master measure circuit is configured to compare a delay between a delayed signal from the calibrated master adjustable delay circuit and an output signal from the second multiplexer.

2. The circuit of claim 1, wherein the master measure circuit further includes a phase detector configured to detect whether the delayed signal from the calibrated master adjustable delay circuit is leading or lagging with regard to the output signal from the second multiplexer.

3. The circuit of claim 2, wherein the master measure circuit is configured to adjust a delay for the calibrated master adjustable delay circuit such that the detection by the phase detector is in equipoise between a leading and lagging detection.

4. The circuit of claim 1, wherein the master measure circuit further includes a finite state machine (FSM) configured to perform the delay measurement.

5. The circuit of claim 1, wherein the delay path is a clock tree and the signal is a forwarded clock.

6. The circuit of claim 1, wherein the calibrated master adjustable delay circuit comprises a pair of dual-master delay circuits.

7. The circuit of claim 1, wherein the calibrated master adjustable delay circuit comprises a slave adjustable delay circuit and a master delay circuit configured to calibrate the slave adjustable delay circuit to provide the known delay.

8. The circuit of claim 1, wherein the master measure circuit comprises a phase-locked loop (PLL).

9. The circuit of claim 1, wherein some of the nodes are located in the delay path upstream from the slave adjustable delay circuit and wherein remaining ones of the nodes are located in the delay path downstream from the slave adjustable delay circuit.

10. The circuit of claim 1, wherein the slave adjustable circuit comprises a plurality of slave adjustable circuits.

11. The circuit of claim 10, wherein the slave adjustable circuits are located in different delay paths.

12. A method, comprising:
   for a signal propagating through a delay path including a plurality of nodes, selecting a first one of the nodes to provide a first version of the signal and selecting a second one of the nodes to provide a second version of the signal;
   delaying the first version of the signal through a calibrated master adjustable delay circuit to provide a first delayed version of the signal;
   measuring a delay between the first version of the signal and the second version of the signal by adjusting the calibrated master adjustable delay circuit so that there is no delay between the first delayed version of the signal and the second version of the signal; and
   controlling a slave adjustable delay element in the delay path responsive to the delay measurement.

13. The method of claim 12, further comprising performing additional delay measurements and adapting the control of the slave adjustable delay element responsive to the series of delay measurements.

* * * * *